United States Patent [19]

MacFadden et al.

[11] 4,182,984
[45] Jan. 8, 1980

[54] MAGNETIC DAMPING ASSEMBLY WITH TEMPERATURE COMPENSATOR FOR WATTHOUR METERS

[75] Inventors: John A. MacFadden; James E. Ramsey, both of Raleigh, N.C.

[73] Assignee: Westinghouse Electric Corp., Pittsburgh, Pa.

[21] Appl. No.: 903,324

[22] Filed: May 5, 1978

[51] Int. Cl.² .................. G01R 1/14; G01R 11/10
[52] U.S. Cl. .................. 324/152; 324/125; 335/217
[58] Field of Search .............. 324/137, 152, 125; 335/217, 225; 310/105, 106; 73/430

[56] References Cited

U.S. PATENT DOCUMENTS

| | | | |
|---|---|---|---|
| 1,626,681 | 5/1927 | MacGahan | 335/217 |
| 1,706,171 | 3/1929 | Kinnard | 324/152 X |
| 1,722,756 | 7/1929 | Kurz | 324/137 X |
| 1,722,758 | 7/1929 | Martin | 324/137 X |
| 1,734,199 | 11/1929 | Bradshaw | 324/152 |
| 1,843,518 | 2/1932 | Reime et al. | 324/152 |
| 1,945,523 | 2/1934 | Flehr | 324/152 X |
| 2,128,131 | 8/1938 | Faus | 324/152 X |
| 2,169,028 | 8/1939 | Leipre | 324/137 X |
| 2,196,898 | 4/1940 | Faus | 324/152 |
| 2,309,414 | 1/1943 | Nobbs | 324/152 X |
| 2,605,301 | 7/1952 | Barnes | 324/152 |
| 2,668,275 | 2/1954 | Goss et al. | 324/152 |
| 2,832,932 | 4/1958 | Baermann | 324/152 |
| 3,054,953 | 9/1962 | Witte | 324/152 |
| 3,076,934 | 2/1963 | Witte et al. | 324/152 |
| 3,173,067 | 3/1965 | Wright | 324/152 X |
| 3,309,152 | 3/1967 | Ramsey et al. | 324/152 X |
| 3,588,768 | 6/1971 | Baermann | 335/225 |
| 3,688,192 | 8/1972 | Ramsey | 324/137 |
| 4,030,031 | 6/1977 | Stucker | 324/152 |

FOREIGN PATENT DOCUMENTS

| | | | |
|---|---|---|---|
| 804694 | 4/1951 | Fed. Rep. of Germany | 324/152 |
| 909753 | 4/1954 | Fed. Rep. of Germany | 324/152 |
| 1151873 | 7/1963 | Fed. Rep. of Germany | 324/152 |
| 247751 | 12/1947 | Switzerland | 324/152 |

Primary Examiner—Gerard R. Strecker
Attorney, Agent, or Firm—R. W. Smith

[57] ABSTRACT

A watthour meter damping assembly includes a U-shaped magnetic yoke and a pair of highly coercive and anisotropic permanent magnets projecting in facing relationship from the ends of the yoke. Opposing pole faces of the magnets form an air gap receiving a meter disc to be magnetically retarded. A single temperature compensator extends over the pole faces of the permanent magnets to form a compensating shunt flux path around the air gap. The compensator and magnetic yoke extend substantially parallel to each other from the inner and outer pole faces, respectively, of the magnet pair.

17 Claims, 8 Drawing Figures

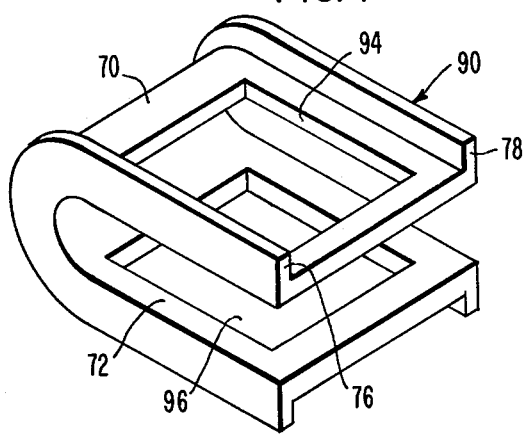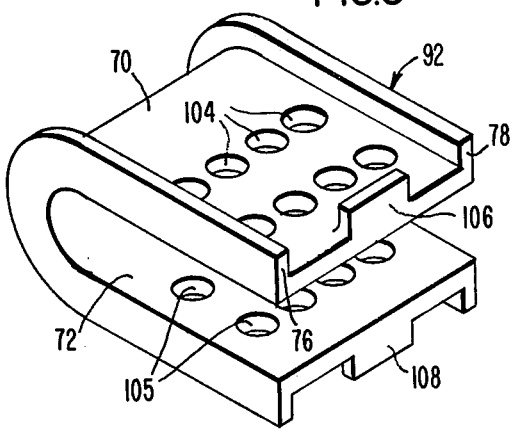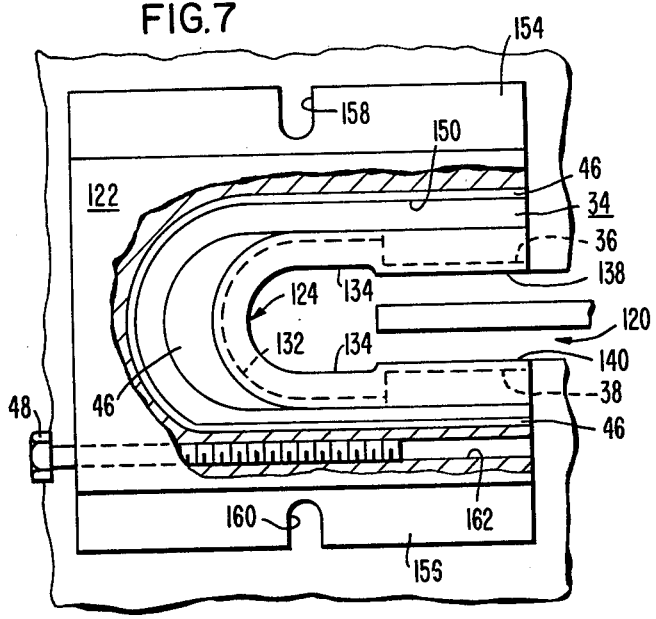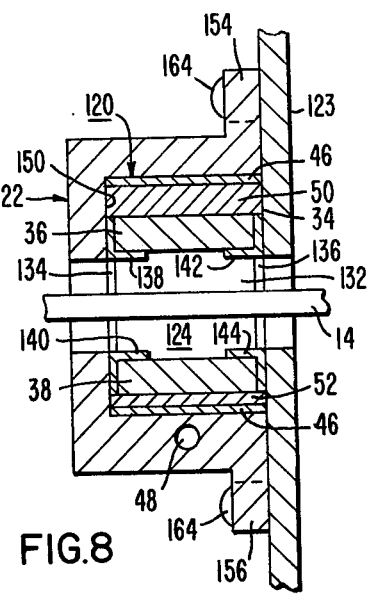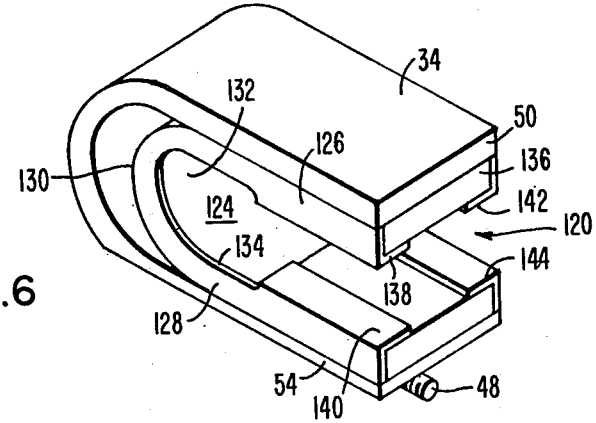

MAGNETIC DAMPING ASSEMBLY WITH TEMPERATURE COMPENSATOR FOR WATTHOUR METERS

BACKGROUND OF THE INVENTION

1. Field of the Invention

This invention relates to a new and improved watthour meter damping assembly and more particularly to such an assembly including a pair of highly coercive and anisotropic permanent magnets extending in opposing relationship from the ends of a magnetic yoke and having a temperature compensator uniquely extending between the permanent magnets.

2. Description of the Prior Art

Induction electromechanical watthour meters generally include an electromagnetic unit having voltage and current sections connected to an electrical load for measuring the consumption of AC electric energy. AC magnetic fluxes from the electromagnetic unit produce a driving torque on a rotatable electroconductive meter disc by interaction with eddy currents induced in the disc by the fluxes. Another general and essential part of a watthour meter includes the magnetic brake or damping assembly. A unidirectional or DC braking magnetic flux provides a retarding torque on the disc which is proportional to the disc speed. The required retarding torque balances the driving torque so that each rotation of the disc is proportional to a predetermined number of watthours of electrical consumption.

The braking magnetic flux is typically provided by permanent magnets which direct the flux through an air gap space receiving the meter disc. The strength of the permanent magnets, the position of the braking magnetic flux in relation to the disc center, the area and density of the braking flux entering the disc, and the length of the air gap spacing determines the amount and consistency of the retarding torque. Maintaining the braking magnetic flux constant is a chief requirement. Eddy currents induced by the permanent magnet fluxes interact with the fluxes to oppose the driving torque in a so-called "square law" relationship. The flux decreases in proportion to the square of the length of the air gap in accordance with this relationship. It is essential that retarding torque that is produced by the damping assembly be kept proportional to the speed of the meter disc for accurate meter measurements.

Thus, the damping assembly air gap must be kept at a constant minimum spacing when the flux is constant for efficient operation over very long meter lifetimes, while being subject to widely varying temperature and atmospheric changes and sometimes to substantial shock and vibration during handling and shipping. Also, when using high energy product permanent magnets such as those made with cobalt-rare earth magnet materials, the high coercivity and highly anisotropic magnet characteristics tend to pull the magnets together during assembly when they are oriented in an opposite facing relationship to define the air gap space. Reductions in the air gap due to the mutual magnetic attractions must be avoided to further maintain stable and accurate meter calibrations.

The damping assemblies also require an adjusting feature to properly calibrate the retarding torque. This adjustment is referred to as a full load adjustment in the watthour meter art. Such adjustments are provided either by changing the position of the braking magnetic flux with respect to the center of the disc or by varying the amount of the air gap flux by means of a magnetic shunt. The former method requires positioning to be made with respect to two effects in which positioning the braking flux further away from the disc center increases the lever-arm effects so as to increase the retarding torque and the other effect increases the retarding torque as increases incur in the rate at which the disc cuts the braking magnetic flux. In many magnetic braking assemblies two or double air gaps are employed and the positioning of these must be made with respect to the above two effects and also with respect to the retarding torque effects of each air gap flux with respect to the other. The second method of adjustment usually includes the use of a soft magnetic screw which varies the reluctance of the flux return path for the permanent magnet fluxes.

Temperature compensation of magnetic damping assemblies is a further essential requirement so that the braking magnetic flux through the air gap is kept constant. The permanent magnet materials typically used in damping assemblies have a negative temperature coefficient so as to decrease in strength with increase of temperature. In the field of watthour meters this compensation is referred to as Class I temperature compensation. A temperature responsive magnetic shunt such as one having a negative temperature coefficient of permeability is typically employed so as to divert larger amounts of the air gap flux at low temperatures and to divert lesser amounts at high temperatures. Proper positioning, size, shape of the temperature compensator and proper selection of the compensator material characteristics are required. Temperature compensators are typically positioned adjacent to and in parallel (shunting) relationship with the direct paths of the braking magnetic fluxes to thereby be positioned in the stray or leakage flux paths surrounding the air gap. With highly directional and anisotropic types of permanent magnet material, such as the cobalt-rare earth magnetic materials, the prior temperature compensator positions adjacent the main flux paths are often not sufficiently effective in capturing and effecting changes in the magnetic fluxes. Also, it is especially desirable to arrange the magnetic damping assemblies so that they are most efficient by minimizing the amounts of leakage and stray fluxes which are generally inherently associated with the high reluctance path of an air gap.

A number of the aforementioned characteristics and requirements of watthour meter damping assemblies are disclosed in prior art patents noted hereinafter. In U.S. Pat. Nos. 1,843,518; 2,309,414; 2,832,932; 3,173,067; and German Pat. No. 804,694 permanent magnet damping assemblies are described including U-shaped magnetic yokes for providing a main flux return path for fluxes passing through opposing magnet pole faces defining an air gap. The U.S. Pat. No. 3,173,067 disposes a temperature compensator forming one of the pole face areas for changing the distribution of the braking magnetic flux rather than shunting a portion thereof from the air gap. In U.S. Pat. Nos. 2,309,414 and 2,832,932 stray flux portions of the permanent magnet fluxes are shunted by temperature compensators attached to the ends or sides of the permanent magnets having pole faces directing fluxes through the air gaps. In the German Pat. No. 804,694 thermally expandable temperature compensators are disclosed for changing the air gap spacing with changes in temperature.

U.S. Pat. No. 4,030,031 discloses a damping assembly having double air gaps and using a pair of highly coercive anistropic permanent magnets made of a cobalt-rare earth magnet material.

U.S. Pat. Nos. 1,722,756; 1,734,199; 1,945,523; 2,605,301; and 3,054,953 disclosed single U- or C-shaped magnetic compensator shunts provided for diverting stray or leakage flux from the damping assembly air gaps. All of the last named patents include shunts made of a magnetic material having a negative coefficient of permeability and positioned on the side or sides of permanent magnet pole pieces for increasing the shunting flux at low temperatures and decreasing the shunting flux at high temperatures. In the U.S. Pat. No. 1,734,199 a U-shaped magnetic compensator arrangement is positioned on the sides of the permanent magnet to vary the shunted flux or fluxes in response to the speed of rotation of the meter disc and not in response to temperature.

SUMMARY OF THE INVENTION

In accordance with the present invention, an improved magnetic damping assembly for induction watt-hour meters includes a U-shaped flat magnetic bar forming a magnetic yoke member having a pair of highly coercive and highly anisotropic permament magnets projecting in facing relationship from the ends of the yoke member. The pole faces of the permanent magnets direct braking flux through an air gap having a constantly maintained minimum length to reduce magnetic losses when producing retarding torques on a meter disc rotatable in the gap. A single end one-piece temperature compensator member extends between and over the magnet pole faces to form a temperature responsive shunt flux path parallel to the air gap and extending parallel to main flux return path through the yoke member. Braking magnetic flux is directed from cobalt-rare earth permanent magnets in one preferred form of the invention through a single air gap to produce a predetermined retarding torque. Positioning of the ends of the one-piece temperature compensator member over the permanent magnet faces efficiently shunts the highly directive flux therefrom. The positioning of the compensator ends and the inherent strength and/or resiliency thereof biases the permanent magnets apart to hold the magnets in place laterally and at a precise spacing against inner sides of the magnetic yoke member prior to final assembly and after final assembly to counteract the magnetic attraction of the permanent magnets that tends to produce variations in the air gap spacing.

In one preferred form of the invention, the temperature compensator member is made of a U-shaped strip of nickel-steel magnetic material having a negative temperature coefficient of permeability and further having substantial strength and rigidity to provide resilient forces against the permanent magnet pole faces to precisely maintain the magnets in place at a predetermined spacing. A compensator member having the one preferred form is formed with right angle edges for engaging opposite sides of each of the permanent magnets to prevent lateral shifting. In a further alternative form of the invention, openings are provided in the pole face contact areas of the compensator member to uncover and expose predetermined portions of the permanent magnet pole faces to proportionately distribute the pole face fluxes passing into the compensator material with a portion thereof passing to the air gap or passing directly into the air gap. One leg of the yoke member is arranged to form one of two parallel paths in the primary flux return path so that the outer path includes a full load adjusting screw made of a soft magnetic material and capable of being threadedly mounted adjacent the one yoke leg.

In a still further alternative form of the invention, a temperature compensation member has a generally U-shaped configuration for holding the magnets at the outer ends thereof and extending rearward in contact with the inner sides of the yoke member. The compensator arrangement provides an additional shunt flux path which is parallel to the main flux return path.

It is a general feature of the present invention to provide a uniquely compact magnetic damping assembly having a pair of permanent magnets made of a highly coercive and highly anisotropic magnetic material and projecting from the parallel ends of a soft magnetic U-shaped yoke member and further having a one-piece temperature compensator member extending within the legs of the yoke member and over the pole faces of the permanent magnet so as to form a temperature compensating magnetic shunt path that is continuous and parallel to the primary air gap flux path and to further establish a predetermined air gap spacing between the permanent magnet pole faces. The assembly is easily and efficiently assembled by die casting into the non-conductive frame of a watthour meter or preassembled in a separate housing attachable to the frame while maintaining a precise air gap spacing during and after the assembling operations. The high energy product characteristic of the permanent magnets, including hard permanent magnet characteristics with high retentivity, affords an assembly that is highly resistant to demagnetization when subjected to high voltage shocks and surges sometimes experienced by conductors connected to a watthour meter having the damping assembly. The arrangement of the permanent magnets in the assembly and in the final assembled form in the watthour meter facilitates magnetization during the assembly of the damping magnet assembly and knocked down demagnetization after the assembly is die cast in a non-conductive frame so as to have a precisely calibrated value for supplying a predetermined braking magnetic flux. The high magnetic flux densities produced by the permanent magnets permit use of small sized permanent magnets and corresponding small magnetic yoke and temperature compensator members highly desirable in the compact arrangement of watthour meter assemblies. The highly directive permanent magnetic flux avoids the use of extensive magnetic shields preventing interaction of the watthour meter electromagnetic driving fluxes and magnetic bearing fluxes. Another feature of the present invention is the temperature compensator providing a combined thermally responsive magnetic shunt path extending within the air gap space and within the space of a U-shaped yoke member so as to have a bracket supporting feature to maintain the temperature compensator member in place and further concurrently to maintain a predetermined air gap spacing between the pole faces of the permanent magnets.

Other novel features and advantages of the present invention will become apparent from the detail description hereinbelow of the drawings briefly described hereinafter.

BRIEF DESCRIPTION OF THE DRAWINGS

FIGS. 4 and 5 are perspective views of alternative embodiments of the temperature compensator included in the magnetic damping assembly shown in FIG. 2;

FIG. 6 is a perspective view of a further alternative of a magnetic damping assembly made in accordance with the present invention;

FIG. 7 is a top elevation view, with parts broken away, of the assembly shown in FIG. 6 as it is carried in a housing in one embodiment; and FIG. 8 is a sectioned view of the housing shown in FIG. 7 as it is mounted to the frame of a watthour meter.

DETAILED DESCRIPTION OF THE PREFERRED EMBODIMENTS

Figure 1:
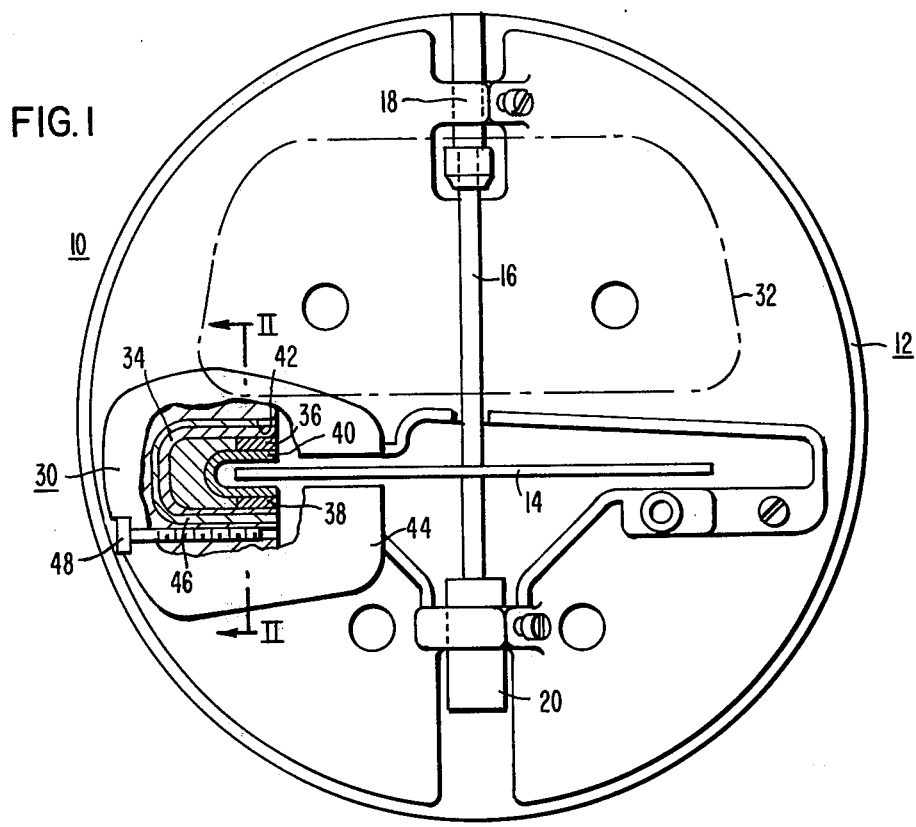
FIG. 1 is an elevational view with parts broken away of an induction watthour meter including a magnetic damping assembly made in accordance with the present invention.

Referring now to the drawings and more particularly to FIG. 1 there is shown an induction watthour meter 10 including a frame 12 made of a non-magnetic die cast material such as aluminum for carrying the different parts of the meter movement. The meter 10 is generally of a type having different meter parts shown and described in U. S. Pat. No. 3,309,152 issued Mar. 14, 1964 to Ramsey et al. and assigned to the assignee of this invention and incorporated herein by reference. The aforementioned Patent may be referred to for more detailed description of the meter which is briefly described hereinafter for a better understanding of the present invention. A rotatable electroconductive disc 14 is carried on a vertical shaft 16 supported by a magnetic bearing assembly. Upper and lower bearing supports 18 and 20 are carried by the frame 12 and are provided as disclosed in U.S. Pat. Nos. 3,143,704; 3,413,550; 3,693,086 and 3,810,683 all assigned to the assignee of this invention.

An electromagnet unit, not shown, is described in the aforementiond U.S. Pat. No. 3,309,152 and includes a voltage section having a voltage winding carried by an E-Shaped laminated core and a current section including a pair of current coils and carried on a C-shaped laminated core. The voltage and current sections direct AC driving magnetic fluxes across an air gap of the electromagnetic unit and through the disc 14. A driving torque is produced in the disc 14 by the interaction of eddy currents with the driving magnetic fluxes inducing the eddy currents as is well understood in the art of watthour meters including the meter 10.

A magnetic damping assembly 30, made in accordance with the present invention, and supported by the frame 12 so as to extend over the top and bottom sides of the disc 14 directs a braking magnetic flux into the disc to provide a retarding torque by eddy current damping which opposes the driving torque. The braking magnetic torque produced by the assembly 30 counterbalances the driving torque so that the rotation of the disc 14 and shaft 16 is proportional to the consumption of electrical energy to be measured by the meter 10. A dial register, an outline of which is shown by broken lines 32 and also disclosed in the aforementioned U.S. Pat. No. 3,309,152, totalizes the rotations of the shaft 16 to provide a dial reading in kilowatt hours of electrical energy consumption as is also well understood in the art of watthour meters.

Figure 3:
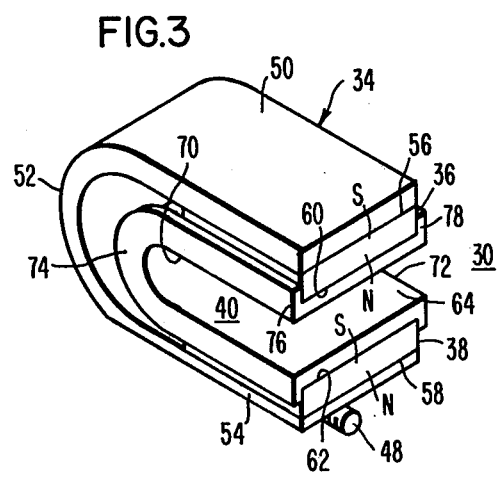
FIG. 3 is a perspective view of the magnetic damping assembly shown in FIG. 1.

The magnetic damping assembly 30 is also shown in the separate perspective view of FIG. 3 and generally includes a U-shaped magnetic yoke and a pair of permanent magnets 36 and 38. The permanent magnets 36 and 38 project from the inner sides of the ends of the yoke 34 in mutually aligned relationship above and below the disc 14. A one-piece temperature compensator 40 extends over the facing pole face sides of the permanent magnets 36 and 38 in a continuous path therebetween within the yoke member 34 as described more fully hereinbelow. The parts of the magnetic damping assembly 30 just described are preferably housed in an integral pocket or cavity 42 formed in a forward projection 44 of the die cast frame 12. Alternatively, the damping assembly can be detachably mounted to the frame as described in connection with the descriptions of FIGS. 7 and 8 and also described in U.S. Pat. No. 3,688,192 issued Aug. 29, 1972 and assigned to the assignee of this invention. The U.S. Pat. No. 3,688,192 describes a separate magnetic damping assembly including a pair of bar permanent magnets housed in an aluminum die cast unit for assembly to the frame of a polyphase watthour meter. The pocket 42 is proportioned to receive the asembly 30 therein in a predetermined position to direct the braking flux into the disc 14.

When the magnetic clamping assembly 30 is mounted in the pocket 42 generally formed in the frame 12 as disclosed in the above-identified U.S. Pat. No. 3,309,152, the damping assembly is received by the frame pocket and is secured therein in a suitable manner such as shown and described in the U.S. Pat. No. 3,054,953, noted hereinabove, and U.S. Pat. No. 3,076,934, also assigned to the assignee of this invention. Both of the last-named patents are incorporated by reference herein and disclose a hardenable fluid material 46 introduced into the space between the assembly 30 and the surfaces of the frame pocket 42 and allowed to solidify. The frame pocket 42 is adjacent a part of the frame extension or projection 44 which has a threaded bore 47 for receiving a flux adjusting member such as formed by a full-load adjusting screw 48.

Referring now further to the details of the damping magnet assembly 30 shown separate from its associated housing and mounting to the frame 12. The U-shaped magnetic yoke member 34 is formed by a flat bar of soft magnetic (non-permanent magnet) material. A first leg 50 of the yoke member 34 receives the permanent magnet 36 against the flat inner side thereof at the outer end. The curved closed end 52 of the yoke 34 extends from the leg 50 to the other leg 54 extending from the closed end 52 and substantially parallel to the leg 50. The inner flat side of the leg 54 receives the permanent magnet 38 at the outer end thereof so that the two magnets 36 and 38 are disposed in opposing facing relationships. The full-load adjusting screw 48 extends parallel and spaced from the center of the leg 54. The adjusting screw 48 is made of soft magnetic iron and is threadably movable in the frame projection 44 toward and away from the length of the leg 54. The thickness of the yoke leg 54 is somewhat thinner than the thickness of the remaining portion of the yoke 34 so as to reach magnetic saturation due to flux flowing through the yoke when such flux does not saturate the leg 50 and end 52 of the yoke. This enables the screw 48 to vary the main flux through the yoke 34. The length of the legs 50 and 52 are suitable so that the permanent magnets 36 and 38 will be oriented over an area of the disc 14 having a predetermined radial distance from the center of the disc. Also the length of the legs 50 and 52 must accommodate the temperature compensator 40 extending within the inner sides of the legs 50 and 54 and is described more fully hereinbelow.

The permanent magnets 36 and 38 have a generally rectangular block shape of substantially identical size having North and South Pole polarities arranged in a series relationship at the aforementioned ends of the legs 50 and 54 of the yoke 34. With the face 56 of the permanent magnet 36 and the face 58 of the permanent magnet 38 adjacent the yoke legs 50 and 54, the magnets 36 and 38 form pole pieces for directing flux from the pole faces 60 and 62 of the magnets 36 and 38, respectively into the air gap 64 having the meter disc 14 rotated therein as described hereinabove.

The permanent magnets 36 and 38 having the rectangular block configuration with mutually opposite parallel sides include a highly coercive and highly anisotropic permanent magnet material so as to have high strength and density of magnetic flux which is significantly directive. Therefore, magnetic flux lines or paths from the magnet pole face 60, for example, goes substantially straight through the air gap 64 to the magnet pole face 62 rather than emanating out from the sides of the air gap 64 through an inefficient stray or leakage flux path. A predetermined portion of the pole face flux is also shunted through the compensator 40. When such high coercive and high anisotropic permanent magnet materials are referred to herein and in the claims it is meant to include cobalt-rare earth permanent magnet materials which are cobalt-rare earth intermetallic compounds or metal alloys which contain cobalt and a plurality of rare earth metals such as described in U.S. Pat. Nos. 3,655,464; 3,684,593; 3,695,945 and 3,802,935; or the equivalents. The aforementioned high coercive and anisotrpic magnetic materials are also characterized as being hard magnetic material having high resistance to demagnitization. Watthour meter damping magnet assemblies are required to withstand severe damagnetization conditions such as produced by transients and high current surges occurring on power lines such as may be produced by lightning strikes. The magnetic damping assembly 30 using the highly coercive and anisotropic permanent magnet materials such as the cobalt-rare earth magnet materials is capable of withstanding substantially higher current surges at the meter than prior damping permanent magnet materials.

The arrangement of the permanent magnets 36 and 38 permits magnetization of the magnets to predetermined and calibrated magnetic flux values after the blocks of permanent magnet material are arranged in the assembly 30 and the assembly is mounted to the meter frame 12. This feature is highly advantageous in watthour meter manufacturing because magnetism of permanent magnets will attract substantial amounts of magnetic particles and debris which is difficult to clean. Typically, the assembly 30 is mounted to the meter frame 12 with the blocks of permanent magnet material 26 and 28 substantially demagnetized. A source of unidirectional electrical energization is applied and a predetermined polarization and magnetization of the permanent magnet is achieved. After, as is well known in the art, an access magnetization is applied the magnetism is decreased to a critical desired value. The demagnetization step is referred to as knockdown by those skilled in the art as described in U.S. Pat. No. 2,668,275. The use of the highly coercive and anisotropic permanent magnet material described herein is sometimes capable of being initially magnetized to a critical value without requiring the knockdown step in some assemblies.

Referring now in further detail to the temperature compensator 40, it forms an important and novel feature of the present invention, as shown in FIG. 3. The temperature compensator 40 includes an integral U-shaped configuration having the opposite legs 70 and 72 connected by a curved or U-shaped closed end 74 extending in a smaller parallel configuration within the inner sides of the magnetic yoke member 34. The compensator 40 is made of a magnetic strip material having a negative temperature coefficient of permeability such as a nickel-iron alloy containing approximately 30% nickel. The thickness of the sheet material is in the order of 0.010 to 0.050 inch (0.025–0.130 cm). The combined configuration of the U-shaped temperature compensator 40, the hardness and strength of the nickel-iron magnetic material and the aforementioned thickness of the material affords high strength and slightly resilient structure uniquely employed in the present invention. The outer ends 70 and 72 of the compensator extend over and cover the pole faces 60 and 62 of the permanent magnets 36 and 38, respectively. The outer side edges of the compensator include oppositely disposed lip portions 76 and 78 extending outwardly at substantially right angles to the remaining flat body portion of the compensator strip material. The lip portions 76 and 78 engage the opposite sides of the permanent magnets 36 and 38. The high strength of the temperature compensator maintains the permanent magnets 36 and 38 oppositely apart and holds them against the inner faces of the yoke legs 50 and 54. The lip portions 76 and 78 prevent lateral displacement of the permanent magnets 36 and 38 and hold them in mutually opposing and facing coalignment. Accordingly, the temperature compensator 40 itself is held in place due to its inherent wedging effect against the pole faces of the permanent magnets 36 and 38. Thus, the temperature compensator 40 forms a temperature responsive shunt path and further maintains the permanent magnets 36 and 38 in place against the inner sides of the yoke legs 50 and 54 so as to advantageously maintain a predetermined air gap spacing for the air gap 64.

Figure 2:
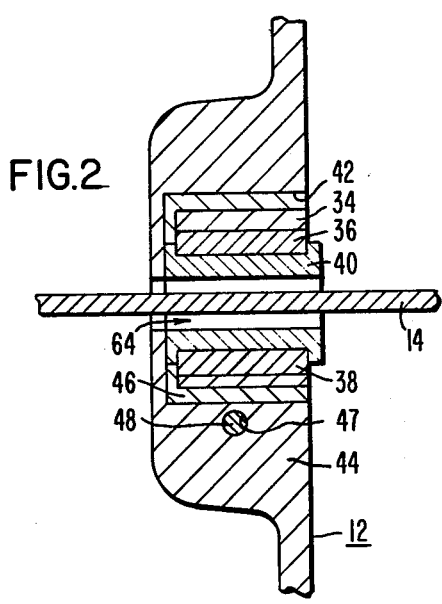
FIG. 2 is a sectional view of FIG. 1 taken along the axis II—II and looking in the direction of the arrows.

In the operation of the magnet damping assembly 30, the permanent magnets 36 and 38 produce pole face magnetic fluxes that direct a braking magnetic flux into the meter disc 14, shown in FIGS. 1 and 2, to provide the predetermined retarding torque thereon. The braking flux path is from one pole face such as pole face 60, through the portion of leg 70 of the U-shaped temperature compensator 40 overlapping the pole face, the air gap 64 receiving the meter disc 14, the portion of the temperature compensator leg 72 overlapping the pole face 62 and to the magnet pole face 62. The primary flux return path for the braking magnetic flux is from the N pole face 58 of the magnet 38 to the yoke end 52. The primary flux is partially diverted at the leg 54 to the full-load adjusting screw 48. The primary flux return path continues through the closed yoke end 52 to the yoke leg 50 and the S pole face of the magnet 36. The flux at the pole face 60 is also shunted through the temperature compensator leg 70, the compensator end 74 and leg 72 to the magnet pole face 62. The temperature responsive and compensating shunt flux flows parallel, opposite, and within the primary flux return path through the yoke member 34. This arrangement is highly efficient since the magnetic flux paths are concentrated within the inner sides of the yoke member 34.

Since the permenent magnet flux is highly directive in accordance with its anisotropic magnetic characteristics the positioning of the compensator over the permanent magnet pole faces is highly effective and controlling the braking magnetic flux flowing through the air gap and into the meter disc. In accordance with the negative temperature coefficient of permeability of the compensator material, a decrease of temperature increases the flux passing through the temperature compensator 40 and an increase of temperature decreases the amount of shunted magnetic flux. This offsets the negative temperature magnetism characteristics of the permanent magnets 36 and 38 to maintain the braking magnetic flux in the air gap 64 constant. The bracket holding feature of the compensator 40 uniquely maintains the air gap space constant due to its high strength as noted hereinabove. The yoke member 34 is made of the soft magnetic iron material having inherently less strength and without the compensator biasing strength the attractive forces between the permanent magnets 36 and 38 would tend to alter the air gap space if the magnets were attached directly to the ends of the yoke legs 50 and 54. While the damping assembly 30 is contemplated to be mounted within a separate housing or within the die cast pocket 42 of the meter frame 12 and secured therein, the finally mounted and secured arrangement will tend to also hold the assembly 30 at a predetermined gap length. However, due to the configuration and position of the permanent magnets die casting or a separate securing material will not always effectively cover the sides of the permanent magnets. Accordingly, even within the pocket 42 or housing the mounted magnets will continue to be held apart at the predetermined air gap spacing by the resiliency of the temperature compensator 40. Also, prior to mounting the assembly 30 to the pocket 42 the air gap spacing is maintained by the compensator, as previously noted.

FIGS. 4 and 5 show alternative embodiments of the temperature compensator 40 and are designated 90 and 92 having substantially the same U-shaped configuration as the compensator 40 and the same parts including lip portions corresponding to the portions 76 and 78 of the temperature compensator 40. When the shunting effect of the temperature compensator 40 is greater than that required, openings 94 and 96 are provided in the legs 70 and 72, respectively, of the compensator 90. The openings 94 and 96 expose predetermined areas of the pole faces of the magnets 36 and 38 so that less of the magnetic flux from the magnet pole faces is shunted through the compensator 90 than is shunted in the compensator 40. Accordingly, a portion of the permanent magnet pole face flux passes directly into the air gap 64 and another portion will either flow through the compensator and to the air gap or solely in the shunt path provided by the compensator 90 around the air gap 64.

The temperature compensator 92 shown in FIG. 5 also substantially corresponds to the general U-shaped configuration of the temperature compensator 40. The single openigs 94 and 96 in each leg 70 and 72 of the compensator 90 are replaced by a plurality of distributed openings 104 and 105 in the legs 70 and 72, respectively, of the temperature compensator 92. The outwardly turned lip edges 76 and 78 of the compensator 92 correspond to the same lip portions of the compensator 40. Additional end edges formed by tabs 106 and 108 are provided on the ends of the legs 50 and 54. The end tabs 106 and 108 overlap and engage the outer ends of the permanent magnets 36 and 36 so as to provide further holding of the magnets in place and prevent outward sliding of the magnets from the yoke legs 50 and 54.

Shown in FIGS. 6,7 and 8 is another preferred embodiment of a magnetic damping assembly 120 made in accordance with the present invention. A separate perspective view is shown in FIG. 6 and the assembly 120 is shown mounted in a detachable housing 122 in FIGS. 7 and 8. The housing 122 replaces the frame extension or projection 44 having the cavity 42 in FIG. 1. In the sectional view of FIG. 8, the housing 122 with the magnetic damping assembly 120 is attached to the watthour meter frame 123 which is a modified form of the frame 12 in the normal operational position adjacent and extending over the top and bottom of the disc 14. Before describing the housing 122 further, the assembly 120 is described hereinafter.

The magnetic damping assembly 120 corresponds to the assembly 30 described above except that a modified temperature compensator 124 replaces the compensator 40. Accordingly, the magnetic yoke 34, permanent magnets 36 and 38, and full load adjusting screw 48 are the same or equivalent as in the assembly 30. The compensator 124 is made of the same strip magnetic material having a negative temperature coefficient of permeability as are the compensators 40, 90 and 92. The U-shaped compensator 124 has legs 126 and 128 and closed end 130. The U-shaped flat central body 132 extends continuously from behind each of the magnets 36 and 38 so as to engage portions of the inner sides of the legs 50 and 54 of the yoke 34 immediately adjacent the magnets 36 and 38, as shown by the broken lines in FIG. 7. Inwardly turned lip portions 134 and 136 extend at approximately right angles from the flat body 132. At the outer free ends of the lip portion 134, flanges 138 and 140, respectively, extend sideward toward similar flanges 142 and 144 which extend sideward from the free ends of the lip portion 136. The pair of flanges 138 and 142 hold the permanent magnet 36 in place against the inner side of the yoke leg 50. The pair of flanges 140 and 144 hold the permanent magnet 38 in place against the inner side of the yoke leg 52. Each of the pair of flanges 138 and 142, and 140 and 144 are spaced apart to expose center portions of the magent pole faces while overlapping opposite side portions of each of the exposed pole faces. This provides a compensator magnet holding configuration and pole face flux control feature similar to those described for the compensators 90 and 92 having the openings 94, 96, 104 and 105 to expose portions of the magnet pole faces. The lengths that the flanges 140 and 144 and the flanges 138 and 142 extend toward each other determines the selective contact area between the pole faces and the compensator.

The temperature compensator 120 provides a larger open area within the yoke legs 50 and 52 and rearward of the permanent magnets 36 and 38 to receive magnetizing and demagnetizing or knockdown apparatus. The compensator 120 further provides an additional flux shunt path in the assembly 120 that is between the legs 50 and 52 of the yoke 34. Thus, temperature compensating flux paths are provided by compensator 120 between the pole faces of the permanent magnet 36 and 38 and between the inner portions of the yoke legs 50 and 52 immediately behind the magnets 36 and 38 and in contact with the compensator. It is believed some forms of the temperature compensator 120 provide improvement in temperature compensation over forms of the embodiments 40 and 90 and 92 because of the aforementioned additional compensating shunt flux path between the yoke legs 50 and 52.

The temperature compensator 120 is received by the housing 122 in a cavity or pocket 150, shown in the broken away part of FIG. 7, which is proportioned to the shape of the outer sides of the yoke 34, as is the frame pocket 42 shown in FIG. 1. A die cast or hardenable fluid material 46, as noted above, fills the spaces between the yoke 34 and the sides of the pocket 150 and between the U-shaped ends of the compensator 120 and the yoke 34. iverging flange mounting portions 154 an 156 of the housing 122 have screw receiving openings 158 and 160. A threaded bore 162 in the housing 122 receives the full load adjusting screw 48. Thus, the screw 48 is accessable from the side of the frame as is shown in FIG. 1.

In FIG. 8, the housing 122 with the assembly 120 is shown attached to the watthour meter frame 123. It is to be understood any of the embodiments of the magnetic damping assemblies described herein can be alternately mounted as in FIGS. 1 or 8. Screws 164 pass through the housing openings 158 and 160 to threadably secure the housing 122 to the frame 123 so that the housing 122 replaces the frame extension 44 shown in FIG. 1. After mounting to the frame 123 the damping magnet assembly 120 is adjusted at the adjusting screw 48 to produce a calibrated braking flux into the disc 14 which is maintained substantially constant with temperature changes.

While the preferred embodiments of the magnetic damping assembly of this invention have been described hereinabove it will be apparent to those skilled in the art that other modifications and improvements made be made within the spirit and scope of our invention.

We claim:

1. A magnetic damping asembly for watthour meters having a rotatable electroconductive disc, comprising:
   a U-shaped magnetic yoke member having oppositely disposed legs extending over opposite sides of the path of rotation of the meter disc;
   a pair of permanent magnets extending from the inner sides of said yoke member so that opposing pole faces thereof have a predetermined spaced relationship for receiving the disc and directing a braking magnetic flux into the disc; and
   a temperature compensator means extending over said pole faces of said permanent magnets and forming a continuous shunt flux path therebetween so that divided portions of magnetic flux from said pole faces are directed either through said hunt flux path or through the space between said pole faces.

2. The magnetic damping assembly as claimed in claim 1 wherein said temperature compensator means includes a substantially U-shaped configuration so that opposite leg portions thereof are biased against said opposing pole faces of aid pair of permanent magnets to maintain said temperature compensator means and said pair of permanent magnets in a predetermined position on said magnetic yoke member with said predetermined spaced relationship being maintained between said pair of permanent magnets by said temperature compensation means.

3. The magnetic damping assembly as claimed in claim 2 wherein said pair of permanent magnets are made of a highly coercive and highly anisotropic permanent magnet material producing magnetic flux paths from the pole faces thereof that are highly directional and without substantial stray fluxes laterally of the pole faces and further wherein said opposite leg portions of the compensator means contact each of the opposing pole faces of the permanent magnets.

4. The magnetic damping assembly as claimed in claim 3 wherein said pair of permanent magnets are made of a cobalt-rare earth permanent magnet material.

5. The magnetic damping assembly as claimed in claim 2 further including a full-load adjusting member made of a soft magnetic material and being movable adjacent one of said legs of said yoke member.

6. The magnetic damping assembly as claimed in claim 5 wherein the one of said magnetic yoke legs being adjacent said full-load adjusting means has a reduced thickness from the remaining portions of said magnetic yoke.

7. The magnetic damping assembly as claimed in claim 3 wherein said opposite leg portions of said temperature compensator means include predetermined openings for exposing predetermined areas of said pole faces of said pair of permanent magnets.

8. The magnetic damping assembly as claimed in claim 2 wherein said opposite legs of said compensator extend from contacting engagement with the opposing magnetic pole faces into contacting engagement with the inner sides of said oppositely disposed legs of said yoke member.

9. A magnetic damping assembly for watthour meters including a frame supporting a rotatable electroconductive disc and a housing carried by said frame for receiving said magnetic damping assembly in a predetermined position over opposite sides of said electroconductive disc, said magnetic damping assembly comprising:
   a U-shaped magnetic yoke member made of a soft magnetic material and having extending leg portions having flat inner sides extending in facing relationship on opposite sides of said disc when said magnetic yoke is carried within said housing;
   a pair of permanent magnets extending from said flat inner sides of said yoke leg portions and terminating at flat pole faces having a predetermined facing and spaced apart relationship for receiving the opposite sides of the electroconductive disc;
   a U-shaped temperature compensator member made of a strip of magnetic material having a negative temperature coefficient of permeability, opposite leg portions of said temperature compensator member extending over said pole faces of said pair of permanent magnets so as to concurrently form a temperature responsive shunt flux path and a support against the pole faces for holding said temperature compensator member in place and for further holding said pair of permanent magnets against said inner sides of said yoke member; and
   a full-load soft magnetic adjusting member disposed adjacent said yoke member and movably mounted in said housing so as to vary magnetic flux in a primary flux return path between said permanent magnets and through said yoke member.

10. A magnetic damping assembly as claimed in claim 9 wherein said temperature compensator member includes lip portions extending along opposite side edges thereof for engaging the mutually opposite sides of said pair of permanent magnets adjacent said pole faces.

11. The magnetic damping assembly as claimed in claim 10 wherein said temperature compensator member includes an opening in at least one of said legs thereof for exposing a portion of said pole face of one of said permanent magnets.

12. A magnetic damping assembly as claimed in claim 11 wherein both of said opposite leg portions of said temperature compensator member include openings for exposing predetermined areas of said pole faces of said pair of permanent magnets.

13. The magnetic damping assembly as claimed in claim 12 wherein said temperature compensator member includes tab portions extending from the end edges of said leg portions and between the side lip portions so that at least three sides of each of said pair of permanent magnets are engaged by said temperature compensator member.

14. The magnetic damping assembly as claimed in claim 9 wherein the damping assembly is secured to said housing by a hardenable fluid material.

15. The magnetic damping assembly as claimed in claim 9 wherein the damping assembly is received by a housing detachably mounted to said frame.

16. The magnetic damping assembly as claimed in claim 10 wherein said lip portions of said temperature compensator member extend toward said inner sides of said yoke member.

17. The magnetic damping assembly as claimed in claim 10 wherein said lip portions extend away from said inner sides of said yoke member and selected areas of the opposite leg portions of said temperature compensator member contact the inner sides of said yoke member.

* * * * *